US009945693B2

(12) United States Patent
Haeberle et al.

(10) Patent No.: US 9,945,693 B2
(45) Date of Patent: *Apr. 17, 2018

(54) SENSOR ARRANGEMENT FOR POSITION SENSING

(71) Applicant: International Business Machines Corporation, Armonk, NY (US)

(72) Inventors: Walter Haeberle, Rueschlikon (CH); Angeliki Pantazi, Rueschlikon (CH); Abu Sebastian, Rueschlikon (CH); Tuma Tomas, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/825,737

(22) Filed: Aug. 13, 2015

(65) Prior Publication Data
US 2016/0265939 A1    Sep. 15, 2016

Related U.S. Application Data

(63) Continuation of application No. 14/645,559, filed on Mar. 12, 2015, now Pat. No. 9,759,578.

(51) Int. Cl.
*G01D 5/16* (2006.01)
*G01R 33/09* (2006.01)
(Continued)

(52) U.S. Cl.
CPC ............... *G01D 5/16* (2013.01); *G01B 7/14* (2013.01); *G01R 33/09* (2013.01); *G01V 3/081* (2013.01)

(58) Field of Classification Search
CPC .. G01D 5/145; G01D 5/24495; G01D 5/2452; G01D 5/2454; G01D 5/2458;
(Continued)

(56) References Cited

U.S. PATENT DOCUMENTS 4,471,304 A * 9/1984 Wolf ................... F15B 15/2846
324/207.24
4,843,365 A    6/1989 Sec
(Continued)

FOREIGN PATENT DOCUMENTS

GB    2508375 A    6/2014

OTHER PUBLICATIONS

List of IBM Patents or Patent Applications Treated as Related.
International Search Report dated Jun. 17, 2016.

*Primary Examiner* — Patrick Assouad
*Assistant Examiner* — Taqi Nasir
(74) *Attorney, Agent, or Firm* — Scully, Scott, Murphy & Presser, P.C.; Daniel P. Morris, Esq.

(57) ABSTRACT

A method for determining of a position of an object using a sensor arrangement that includes a first magnetoresistive element and a second magnetoresistive element. A source provides a magnetic field with first and second magnetic poles. The source is arranged between the first magnetoresistive element and the second magnetoresistive element with the first magnetic pole facing the first magnetoresistive element and the second magnetic pole facing the second magnetoresistive element. The first magnetoresistive element is arranged in the magnetic field and provides a first output signal dependent on a position of the first magnetoresistive element relative to the magnetic field source. The second magnetoresistive element is arranged in the magnetic field and provides a second output signal dependent on a position of the second magnetoresistive element relative to the magnetic field source. A measurement unit determines a position of the magnetic field source relative to the first and the second magnetoresistive elements dependent on the first output signal and the second output signal.

11 Claims, 10 Drawing Sheets

(51) Int. Cl.
  *G01V 3/08*        (2006.01)
  *G01B 7/14*        (2006.01)

(58) Field of Classification Search
  CPC ...... G01D 5/246; G01D 5/249; G01D 5/2497; G01D 5/345; G01D 5/34707; G01D 5/34715; G01D 7/00
  USPC ............ 324/201–207.26, 259, 174, 146, 152
  See application file for complete search history.

(56) References Cited

U.S. PATENT DOCUMENTS

| | | | |
|---|---|---|---|
| 5,608,317 A * | 3/1997 | Hollmann | G01B 7/02 324/207.2 |
| 8,269,486 B2 * | 9/2012 | Hammerschmidt | H01L 41/47 324/200 |
| 8,283,921 B2 | 10/2012 | Huber et al. | |
| 2003/0112564 A1 * | 6/2003 | Granstrom | B82Y 10/00 360/324.12 |
| 2005/0127900 A1 * | 6/2005 | Johnson | G01D 5/145 324/207.2 |
| 2009/0045807 A1 * | 2/2009 | Nishida | G01D 5/145 324/207.2 |
| 2010/0085041 A1 * | 4/2010 | Pozidis | B82Y 15/00 324/207.21 |
| 2011/0298452 A1 | 12/2011 | Mao et al. | |
| 2013/0066587 A1 * | 3/2013 | Kalathil | G01D 5/06 702/150 |
| 2014/0275956 A1 * | 9/2014 | Fan | A61B 5/05 600/409 |
| 2015/0204647 A1 * | 7/2015 | Yi | H01L 43/14 324/207.17 |

* cited by examiner

SENSOR ARRANGEMENT FOR POSITION SENSING

FIELD OF THE INVENTION

The present invention relates to a sensor arrangement for position sensing and to a method for supporting determining the position of an object.

BACKGROUND

High bandwidth, high resolution nanoscale sensing is a key enabling technology for nanoscale science and engineering. Application areas include life sciences, scanning probe microscopy, semiconductor fabrication and material science. Currently available position sensors based on optics, capacitors or inductive coils, although accurate and fast, do not scale down to micro-scales for use in microstructures or in large-scale point-wise position sensing of macro-structures. Thermo-electric position sensors, on the other hand, scale down to micro-scale, but suffer from low resolution and bandwidth.

A known position sensing concept is based on the property of magnetoresistance (MR). Magnetoresistance is the property an electrical resistance of a conductive layer sandwiched between ferromagnetic layers changes as a function of a magnetic field applied to the layers. A magnetoresistive sensor typically uses this property to sense the magnetic field.

BRIEF SUMMARY OF THE INVENTION

According to an embodiment of one aspect of the invention, a sensor arrangement is provided for position sensing. The sensor arrangement comprises a first magnetoresistive element, a second magnetoresistive element, and a magnetic field source providing a magnetic field with a first magnetic pole and a second magnetic pole. The magnetic field source is arranged between the first magnetoresistive element and the second magnetoresistive element with the first magnetic pole facing the first magnetoresistive element and the second magnetic pole facing the second magnetoresistive element. The first magnetoresistive element is arranged in the magnetic field and provides a first output signal dependent on a position of the first magnetoresistive element relative to the magnetic field source. The second magnetoresistive element is arranged in the magnetic field and provides a second output signal dependent on a position of the second magnetoresistive element relative to the magnetic field source. A measurement unit is configured to determine a position of the magnetic field source relative to the first and the second magnetoresistive element dependent on the first output signal and the second output signal.

In embodiments, the sensor arrangement may comprise one or more of the following features:
- each of the magnetoresistive elements comprises a stack of layers including at least a conductive layer in between two magnetic layers which layers have a longitudinal extension along a longitudinal axis and a lateral extension along a transverse axis,
- the magnetic field source has a dipole axis defined by the first and the second magnetic pole extending along a vertical axis orthogonal to a plane defined by the longitudinal axis and the transverse axis,
- the magnetic field source is movable relative to the first and second magnetoresistive element along the longitudinal axis, a position thereof along the longitudinal axis is to be sensed by the sensor arrangement,
- the measurement unit is configured to determine the position along the longitudinal axis by adding the first output signal and the second output signal,
- the magnetic field source is movable relative to the first and second magnetoresistive element along the vertical axis, a position thereof along the vertical axis is to be sensed by the sensor arrangement,
- the measurement unit is configured to determine the position along the vertical axis by computing a difference between the first output signal and the second output signal,
- multiple first magnetoresistive elements arranged in the magnetic field in a row along the longitudinal axis and facing the first magnetic pole,
- multiple second magnetoresistive elements arranged in the magnetic field in a row along the longitudinal axis and facing the second magnetic pole,
- the magnetic field source is dimensioned relative to the multiple first magnetoresistive elements such that the magnetic field only affects a single of the multiple first magnetoresistive elements at a time but not adjacent first magnetoresistive elements,
- the magnetic field source is a permanent magnet which has a width less than the longitudinal extension of the first magnetoresistive elements,
- the measurement unit is configured to identify the single first magnetoresistive element out of the multiple magnetoresistive elements that shows a change in its first output signal which change results from the magnetic field source passing by the single first magnetoresistive element,
- the measurement unit is configured to derive the position along the longitudinal axis from a known position of the single first magnetoresistive element within the row of the multiple first magnetoresistive elements.
- the magnetic field source is dimensioned relative to the multiple first magnetoresistive elements such that the magnetic field not only affects a single of the multiple first magnetoresistive elements but also adjacent first magnetoresistive elements,
- the magnetic field source is a permanent magnet which has a width along the longitudinal axis exceeding the longitudinal extension of the first magnetoresistive element,
- a magnetization orientation of both of the magnetic layers of the multiple first magnetoresistive elements is unpinned,
- the measurement unit is configured to subtract first output signals of adjacent first magnetoresistive elements from each other,
- the measurement unit is configured to determine the position along the longitudinal axis dependent on a resulting difference signal,
- a magnetization orientation of one of the magnetic layers of the multiple first magnetoresistive elements is pinned,
- the measurement unit is configured to add the first output signals of adjacent first magnetoresistive elements,
- the measurement unit is configured to determine the position along the longitudinal axis dependent on a resulting sum signal,
- the multiple first magnetoresistive elements are arranged in the row are offset from each other along the vertical axis, a middle first magnetoresistive element is arranged at a closest vertical distance from the magnetic field source amongst the multiple first magnetoresistive elements of the row, outmost first magnetoresistive elements are arranged at a farthest vertical distance from the magnetic field source amongst the multiple first magnetoresistive elements of the row, one of the magnetoresistive elements and the magnetic field source is coupled to an object, the position of which object is to be sensed by the sensor arrangement.

According to an embodiment of another aspect of the present invention, a method is provided for supporting determining the position of an object. One of a magnetic field source providing a magnetic field with a first magnetic pole and a second magnetic pole and a first and a second magnetoresistive element is coupled with the object. The magnetic field source is arranged between the first magnetoresistive element and the second magnetoresistive element with the first magnetic pole facing the first magnetoresistive element and the second magnetic pole facing the second magnetoresistive element. Output signals are received from the first and the second magnetoresistive elements dependent on their position relative to the magnetic field source. A position of the object is determined dependent on the first output signal and the second output signal.

Embodiments described in relation to the aspect of the position sensor shall also be considered as embodiments disclosed in connection with any of the other categories such as the method.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings. The figures are illustrating.

DETAILED DESCRIPTION OF THE EMBODIMENTS

As an introduction to the following description, it is first pointed at a general aspect of the invention concerning a sensor arrangement based on the magnetoresistive effect.

A magnetoresistive sensor preferably comprises a magnetoresistive element comprising a stack of layers which stack of layers includes at least a conductive layer in between two magnetic layers, and preferably in between two ferromagnetic layers. Specifically, the magnetoresistive element is a giant magnetoresistive element based on the underlying effect wherein in a layer stack comprising a non-magnetic conductive layer sandwiched between two ferromagnetic layers a change in the electrical resistance can be observed subject to a magnetization orientation in the ferromagnetic layers. In the absence of an external magnetic field, the magnetization orientation of the corresponding ferromagnetic layers is antiparallel. By means of applying an external magnetic field to at least one of the ferromagnetic layers the subject magnetization orientation is changed which in turn leads to the magnetization orientation in the two ferromagnetic layers becomes parallel which in turn causes the electrical resistance of the layer stack to change. The electrical resistance of the layer stack is also denoted as electrical resistance of the magnetoresistive element. The change in the electrical resistance may be monitored and taken as a measure for the presence of an external magnetic field applied. When such external magnetic field is generated by a magnetic field source attached to an object, a position of such object may be determined with respect to the magnetoresistive element. Specifically, a significant change of the electrical resistance in the conductive layer can be observed when the magnetization orientation of the ferromagnetic layers is changed between a parallel alignment to an antiparallel alignment or vice versa. In a parallel alignment of the magnetization orientation of the ferromagnetic layers the electrical resistance in the conductive layer is rather low while in an antiparallel alignment of the magnetization orientation of the ferromagnetic layers the electrical resistance in the conductive layer is rather high. The change in conductivity is based on spin-dependent interfacial electron scattering. Electrons passing the magnetoresistive element may show a short mean free path at antiparallel magnetization orientation in the ferromagnetic layers owed to an increased spin dependent electron scattering at the interfaces between the conductive layer and the ferromagnetic layers while electrons may show a longer mean free main path owed to a less spin dependent interfacial electron scattering when the ferromagnetic layers show a parallel magnetization orientation.

The magnetoresistive element hence preferably comprises a stack of layers which at least includes one conductive layer in between two ferromagnetic layers, but which stack of layers may include multiple conductive layers sandwiched between adjacent ferromagnetic layers, wherein an overall electrical resistance of the stack of layers may finally be measured and allow for a determination of the position of the field generating magnet relative to the magnetoresistive element. An external magnetic field applied may cause the magnetization orientation in these ferromagnetic layers to switch from an antiparallel alignment to a parallel alignment or vice versa. Generally, and specifically for the present embodiments of the invention, the magnetization orientation of both ferromagnetic layers may be floating or, alternatively, the magnetization orientation of one of the ferromagnetic layers may be pinned such that its magnetization orientation may not change even under the application of an external magnetic field. The external magnetic field may then only act on the other ferromagnetic layer and cause its magnetization orientation to change subject to a position the magnet takes.

In the context of the present embodiments of the invention, the following geometrical definitions are used: The layers of the layer stack may have a longitudinal extension along a longitudinal axis and a lateral extension along a transverse axis. Accordingly, a height of the stack extends orthogonal to a plane defined by the longitudinal and the transverse axis along a vertical axis. A sensor central axis of the magnetoresistive element is defined as an axis along the vertical axis, and at half of the longitudinal extension of the layers. It is preferably assumed that a magnetic field source and/or an object comprising the magnetic field source is at least movable along the longitudinal axis, which means that the magnetic field source is movable along the longitudinal extension of the layers of the layer stack. Preferably, the magnetic field source is arranged at a vertical distance D>0 from the magnetoresistive element such that the magnet field source and an upper surface of the magnetoresistive element are spaced apart along the vertical axis by the distance D. Moreover, the magnetic field source provides a magnetic field with a North (N) and a South (S) pole. A dipole axis is assumed to be a straight connection between the N pole and the S pole.

In conventional magnetoresistive position sensing concepts a dipole axis of the magnetic dipole of the magnet is aligned in parallel to a longitudinal extension of the layers of the layer stack contributing to the magnetoresistive element. Given that a gradient of the magnetic field is responsible for generating a change in the magnetization orientation of the one or more ferromagnetic layers, it was observed that in the conventional concept the gradient of the magnetic field along the longitudinal extension of the layers of the stack is rather low. The gradient is defined as a change in magnetic flux at any location. However, the higher the gradient of the magnetic field is along the longitudinal extension of the layers of the stack the higher the sensitivity/resolution of the sensing scheme is given that only a small variation of the position of the magnet may cause an impact on the magnetization orientation of the ferromagnetic layers because such small variation in position still leads to a substantial change in magnetic flux owed to the high gradient. In addition, it was observed that for typical magnet geometries such as rectangular permanent magnets, an absolute strength of the magnetic field at a given distance from the magnet increases with the gradient. Because there is an upper bound on the strength of the magnetic field after which the magnetoresistive element saturates, the gradient of the magnetic field that can effectively be used for sensing is limited.

According to an embodiment of the present invention, the dipole axis of the magnetic field source is aligned orthogonal to the plane defined by the longitudinal axis and the transverse axis. Hence, the dipole axis is also orthogonal to a sensing direction of the magnetoresistive element which sensing direction is defined by the longitudinal extension of the layers of the stack in direction of the longitudinal axis. Orthogonal in this context shall include tolerances of +/−20° degrees, i.e. the dipole axis is supposed to be arranged with a range of 70° to 110° degrees with respect to the plane defined by the longitudinal axis and the transverse axis.

In one embodiment of the present invention, the magnetic field source is a permanent magnet of a size comparable to the size of the stack of layers. This includes a width of the permanent magnet along the longitudinal axis comparable to the longitudinal extension of the layers of the stack. In this context, comparability preferably includes a width of the permanent magnet not more than ten times the longitudinal extension of the layers of the stack, and preferably not less than half of the longitudinal extension of the layers of the stack. In a very preferred embodiment, the magnet is of rectangular shape in a plane defined by the longitudinal axis and the vertical axis, and in another very preferred embodiment is of cuboid shape or rectangular prism shape cubic shape. According to another embodiment of the present invention, the magnetic field source is embodied as electromagnet.

The present idea is to place the magnetoresistive elements to both poles of the magnetic dipole. By doing so, completely new sensing regimes can be achieved. In one embodiment, the sensors placed at the opposite poles of the magnetic field source may be used to suppress an inherent sensitivity of the magnetoresistive elements to motion in a vertical direction. This can be a particularly powerful technique which is of great importance in one-dimensional sensing applications. In another embodiment, the dual-pole sensing is used in a different read-out configuration to increase the sensitivity in the vertical axis, therefore enabling simultaneous sensing in two directions. Hence, the concept of dual-pole sensing has many advantages.

In the figures, same or similar elements are denoted by the same reference signs.

Figure 1:
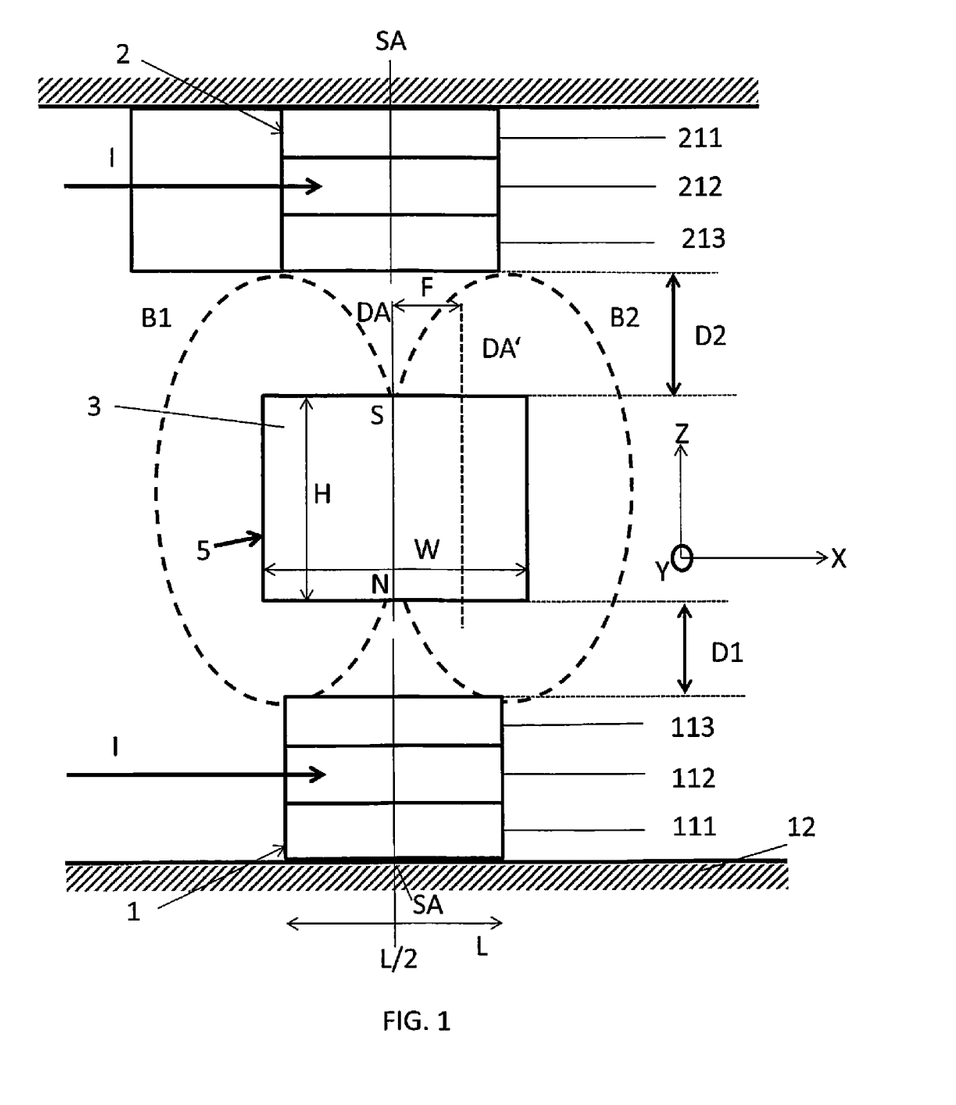
FIG. 1 a block diagram of a sensor arrangement according to an embodiment of the present invention, FIG. 2 diagrams illustrating an impact of a magnetic field on a magnetoresistive element according to an embodiment of the present invention, FIG. 3 a diagram illustrating an impact of a magnetic field on a magnetoresistive element according to an embodiment of the present invention, FIG. 4 a block diagram of a sensor arrangement according to an embodiment of the present invention, FIG. 5 a diagram illustrating the effect of adding the output signals of the first and the second MR elements, as is performed in the sensor arrangement of FIG. 4, FIG. 6 a block diagram of a sensor arrangement according to another embodiment of the present invention, FIG. 7 a diagram illustrating the effect of subtracting the output signals of the first and the second MR elements, as is performed in the sensor arrangement of FIG. 6, FIG. 8 a block diagram of a sensor arrangement according to a further embodiment of the present invention, FIG. 9 a diagram illustrating the effect of subtracting the output signals of the first MR elements, as is performed in the sensor arrangement of FIG. 8, FIG. 10 a block diagram of a sensor arrangement according to a further embodiment of the present invention, FIG. 11 a diagram illustrating the effect of subtracting the output signals of the first MR elements, as is performed in the sensor arrangement of FIG. 11, FIG. 12 a characteristic of an MR element with and without a pinned magnetic layer, FIG. 13 a diagram illustrating the effect of subtracting the output signals of multiple first MR elements with a pinned magnetic layer, FIG. 14 a block diagram of a sensor arrangement according to a further embodiment of the present invention, FIG. 15 a characteristic of the sensor arrangement of FIG. 14, FIG. 16 a block diagram of a sensor arrangement according to another embodiment of the present invention, and FIG. 17 a block diagram of a sensor arrangement according to another embodiment of the present invention.

FIG. 1 illustrates a schematic side cut of sensor arrangement according to an embodiment of the present invention comprising a first magnetoresistive element 1—in short first MR element 1, a second magnetoresistive element 2—in short second MR element 2, and a magnetic field source 3.

The first and second MR elements 1 and 2 are elements specifically underlying the giant magnetoresistivity phenomenon, wherein in thin magnetic multilayers with one or more conductive layers in between spin coupling occurs. The first MR element 1 comprises a layer stack arranged on a substrate 12 which layer stack includes at least a first ferromagnetic layer 111, a conductive and non-magnetic layer 112 and a second ferromagnetic layer 113. Magnetic moments of the ferromagnetic layers 111 and 113 are naturally aligned antiparallel with respect to each other when no external magnetic field is applied. In case an external magnetic field of sufficient strength is applied, magnetic moments become parallel in the ferromagnetic layers 111 and 113, i.e. the magnetization orientations in the ferromagnetic layers 111 and 113 are aligned in parallel. An antiparallel magnetization orientation in the ferromagnetic layers 111 and 113 result in a rather low mean free path of electrons passing the layer stack leading to a rather high electrical resistance in the layer stack. On the other hand, a parallel magnetization orientation in the ferromagnetic layers 111 and 113 result in a rather high mean free path of electrons passing the layer stack leading to a rather low electrical resistance in the layer stack. This effect is based on the dependence of electron scattering on the spin orientation at the interfaces of the layers 111, 112 and 113. The same holds for the second MR element 2 comprising a layer stack arranged on a substrate 22 which layer stack includes at least a first ferromagnetic layer 211, a conductive and nonmagnetic layer 212 and a second ferromagnetic layer 213.

The layers of each layer stack show a longitudinal extension L along the longitudinal axis X. The layers also extend along the transverse axis Y into the plane of projection. A current I may be applied to each layer stack during position sensing. The layers of the stacks are arranged vertically, i.e. along vertical axis Z on top of each other.

The magnetic field source 3 may in the present embodiment be a permanent magnet. Preferably, miniature ultra-thin magnetic dipoles may be used for enabling the stack of layers being exposed to magnetic fields with a very high gradient. A position sensing resolution of less than <200 pm over 100 kHz may be achieved. The magnetic field source 3 presently is of rectangular shape with a width W along the longitudinal axis X, a depth not visible along the transverse axis y, and a height H along the vertical axis Z. The width W of the magnet exceeds the longitudinal extension L of the layer stack.

In the present position, a dipole axis DA of the magnetic field source 3 coincides with a sensor central axis SA of the MR elements 1 and 2 which are preferably mechanically coupled and do not change position with respect to each other. This means, the magnetic field source 3 is centered above the MR elements 1 and 2. The magnetic field source 3 provides a magnetic field illustrated in dashed lines which virtually may be separated into a first portion B1 and a second portion B2. As can be derived from FIG. 1, magnetic field lines from both portions B1 and B2 may affect the layer stacks of the first and the second MR elements 1 and 2 and as such impact the magnetization orientation of the ferromagnetic layers 113 and/or 111, and 213 and/or 211. Both portions B1 and B2 qualify by a high gradient when meeting the first MR element 1 which is desired for achieving a high resolution because yet small changes in the position of the corresponding magnetic field source 3 may cause a realignment of the magnetic domain orientation in the ferromagnetic layers 111, 113 which in turn may affect the conductivity of the layer stack. The same holds with respect to the second MR element 2.

Hence, while in conventional position sensor arrangements the magnetic field source is aligned with its dipole axis DA in parallel to a sensing direction X of the MR element 1 coinciding with the longitudinal extension of the layers, in the present embodiment the magnet field source 3 is aligned with its dipole axis DA orthogonal to the sensing direction X of the first and second magnetoresistive elements 1 and 2. For this reason, both a high gradient and a low strength of the magnetic field can be achieved at the same time. The low strength of the magnetic field is owed to the fact that the magnetic field lines go through zero magnitude because the magnetic field in the subject portion when projected to the sensing direction changes direction.

Figure 2:
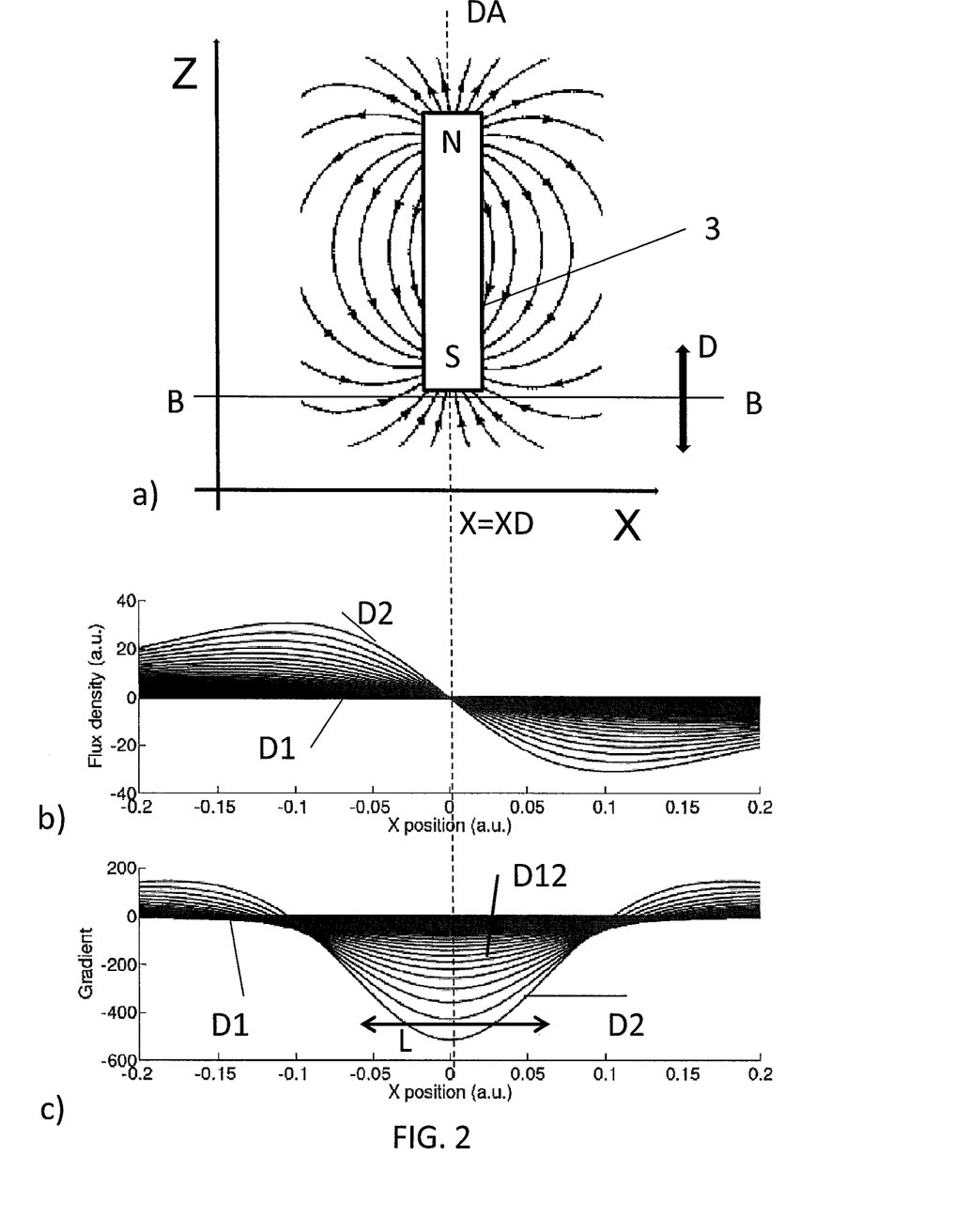

FIG. 2 shows diagrams illustrating an impact of a magnetic field of a magnetic field source 3 on an MR element according to an embodiment of the present invention. In diagram 2a) the magnetic field lines of a magnetic dipole comprising a first magnetic pole N and a second magnetic pole S are shown wherein the effect is shown solely with respect to a single MR element, a longitudinal extension of which is indicated by line B-B which MR element may be positioned at various distances D from the magnet as is indicated by the double arrow. The magnetic field lines are shown in a plane defined by the longitudinal axis X and the vertical axis Z. In diagram 2b), a corresponding flux density—also denoted as strength of the magnetic field—is shown over the longitudinal axis X, and specifically is shown for different distances D between the magnetic field source 3 and the MR element. It can be derived from diagram 2b) that the magnetic flux is zero at the location of the dipole axis X=XD while it is non-zero for X outside XD. In diagram 2c), the corresponding gradient of the magnetic field is shown over the longitudinal axis X, and specifically is shown for different distances D between the magnet and the magnetoresistive element with D1>D2. It can be derived from diagram 2c), that at the location of the dipole axis X=XD, the gradient has a maximum value while outside the dipole axis X=XD the gradient is lower in its absolute value. It further can be derived from diagram 2b) that the bigger the distance D is the lower the magnetic flux density is while the closer the MR element is arranged with respect to the magnet the higher the magnetic flux density is. On the other hand, it can be derived from diagram 2c) that the closer the MR element gets to the magnet, the higher the maximum gradient value becomes at X=XD.

In terms of resolution a high gradient and a low flux density is desired at the same time. Diagram 2c) in addition shows that a determination of the distance D may preferably also take into account the linearity of the gradient. It may be desired at the same time to provide a position sensor sensing with a rather linear property over the sensing range. However, from diagram 2c) it can be derived that the closer the magnetoresistive element is arranged with respect to the magnetic field source 3, the higher the maximum gradient becomes, but after a point the gradient becomes less linear across the sensing range.

Figure 3:
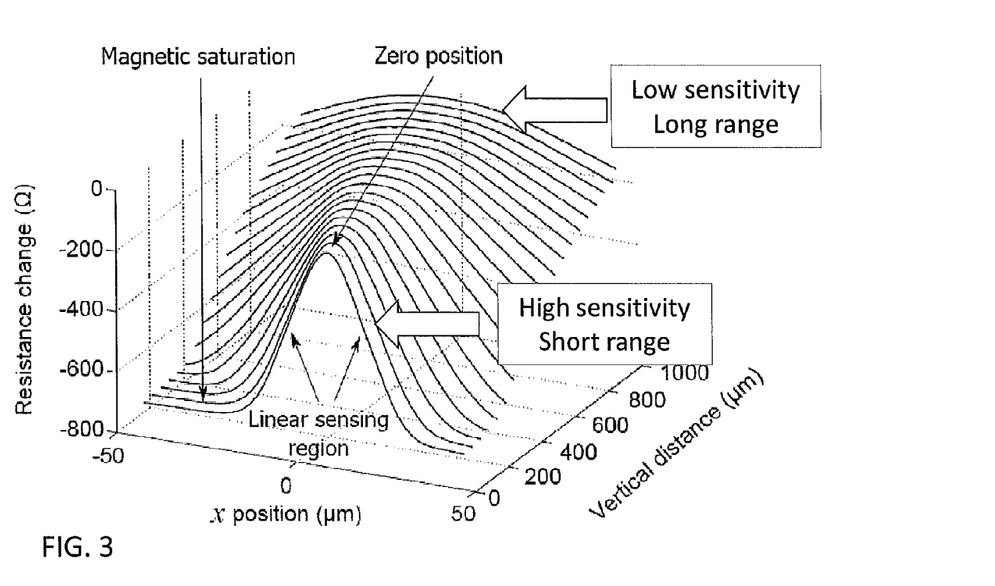

FIG. 3 depicts a diagram illustrating an impact of a magnetic field on a magnetoresistive element according to an embodiment of the present invention. It is assumed that in the x=0 longitudinal position the magnetic dipole is arranged centered on the magnetoresistive element 1 such as shown in FIG. 1, i.e. the dipole axis DA coincides with the sensor axis SA. As can be derived from FIG. 3, in a region to the left and right of x=0, there is a linear relation between the change in resistance and x. However, at some longitudinal position x magnetic saturation occurs such that the change in resistance is not indicative of the longitudinal position x. However, it is only a rather short sensing range in x, where linearity is given. Generally, the term sensing range is defined as the range in dimension X where no saturation occurs.

On the other hand, the diagram in FIG. 3 shows the effect of varying the vertical distance between the magnetoresistive element and the magnetic dipole: It can be derived that for short vertical distances a high sensitivity/slope can be achieved while for longer vertical distances the sensitivity drops. On the other hand, for longer vertical distances, the sensing range in x broadens, and saturation does not occur. The magnetic dipole may be positioned relative to the magnetoresistive element at a vertical distance such that a large gradient of the applied magnetic field is achieved in the sensing range while at the same time good linearity properties over the sensing range are provided. Such arrangement may lead to a high bandwidth sensing but on the other hand to a limited sensing range owed to the magnetic saturation.

With this insight and having returned to FIG. 1, it follows that in a first embodiment in which the sensing direction is along the longitudinal axis X and hence the position to determine is a position in X, variations of the position along the vertical axis Z may have heavy impact on the measurement result. For example, the magnetic field source 3 may be attached to an object while the first and the second MR elements 1 and 2 are stationary. The position of which object along the longitudinal axis X is to be determined, however, the object may not always take a fixed z-position but may suffer disturbances along the vertical axis Z. For this reason, it is suggested to provide the second MR element 2 on the opposite end of the magnetic field source 3, i.e. facing the second magnetic pole S while the first MR element 1 faces the first magnetic pole N of the magnetic field source 3.

In the example of FIG. 1, it is assumed that a distance D1 between the first MR element 1 and the magnetic field source 3 is less than a distance D2 between the second MR element 2 and the magnetic field source 3. However, a distance between the first and the second MR element 1, 2 is fixed. By combining output signals of the first and the second MR element 1, 2, any variations in the vertical axis Z between the magnetic field source 3 and the first and the second MR elements 1, 2 can be levelled out.

Figure 5:
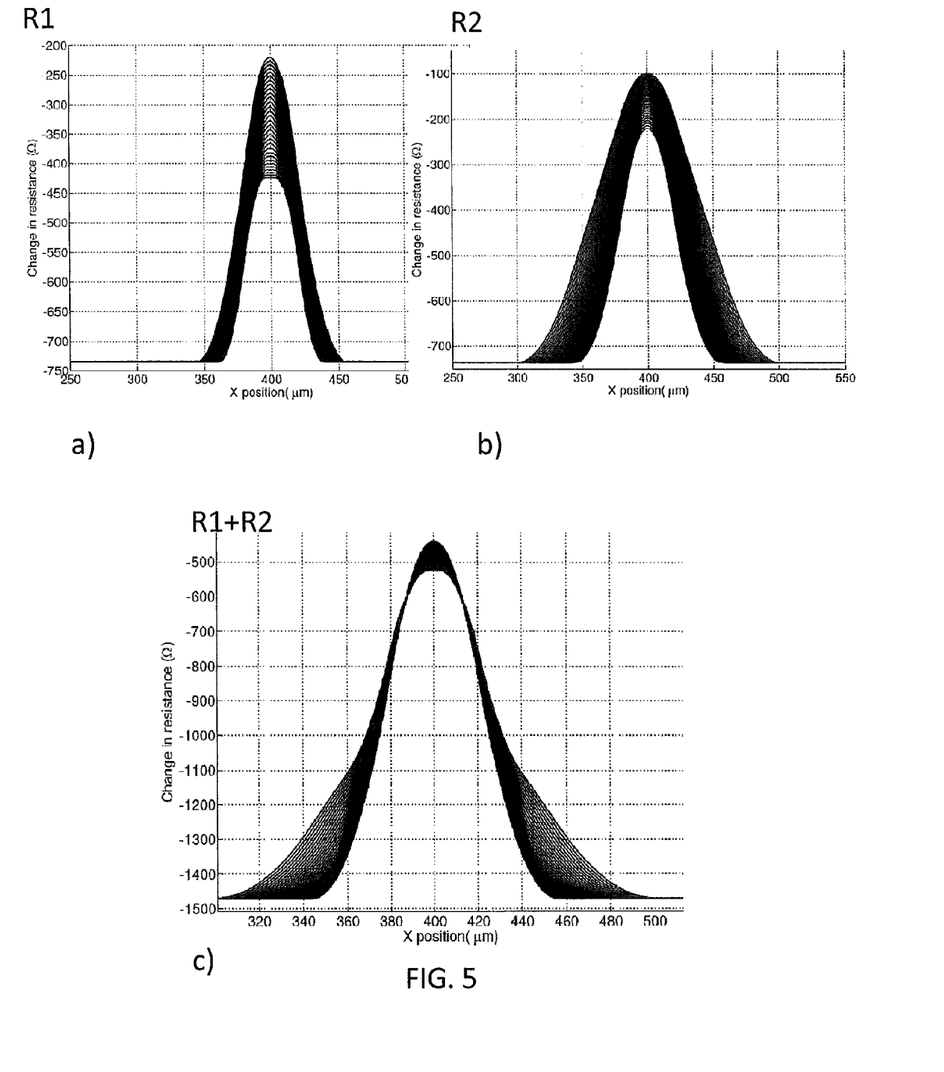

This can be illustrated by the diagrams in FIG. 5. Diagram 5*a*) illustrates an output signal R1 of the first MR element 1 of FIG. 1 for varying distances D1 from the magnetic field source 3, wherein the darker curves DC represent larger distances D1, e.g. the outmost dark curve may represent a distance D1 of 400 µm, while the brighter curves BC represent smaller distances D1, e.g. the innermost bright curve may represent a distance D1 of 100 µm. The same is shown in diagram 5*b*) for the second MR element 2, wherein here the various curves are plotted for varying distances D1, which on the other hand results in varying distances D2. The innermost dark curve DC represents a distance D1 of 400 µm, i.e. a small distance D2, while the outmost bright curve BC represents a distance D1 of 100 µm which results in a larger distance D2. Diagram 5*c*) illustrates an addition of output signals R1+R2 for varying distances D1, again under the assumption that the dark curve DC represent D1=400 µm, and the bright curve BC represents D1=100 µm. Hence, it can be derived from diagram 5*c*) that in the present example in a sensing range between 375 µm and 385 µm and 415 µm and 425 µm, the output signal R1+R2 is linear and independent from variations of the magnetic field source in z-direction.

Figure 4:
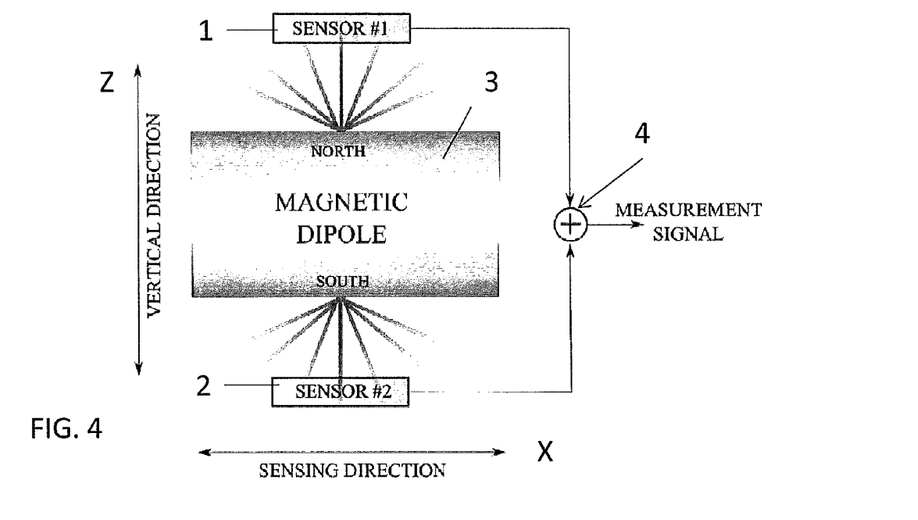

A block diagram of this embodiment is shown in FIG. 4 comprising the magnetic field source 3 and a first and a second MR element 1, 2 facing the magnetic poles N(orth) and S(outh), wherein the first output signal R1 of the first MR element 1 and the second output signal R2 of the second MR element 2 are added by a measurement unit 4, which in this example comprises a simple adder.

Figure 7:
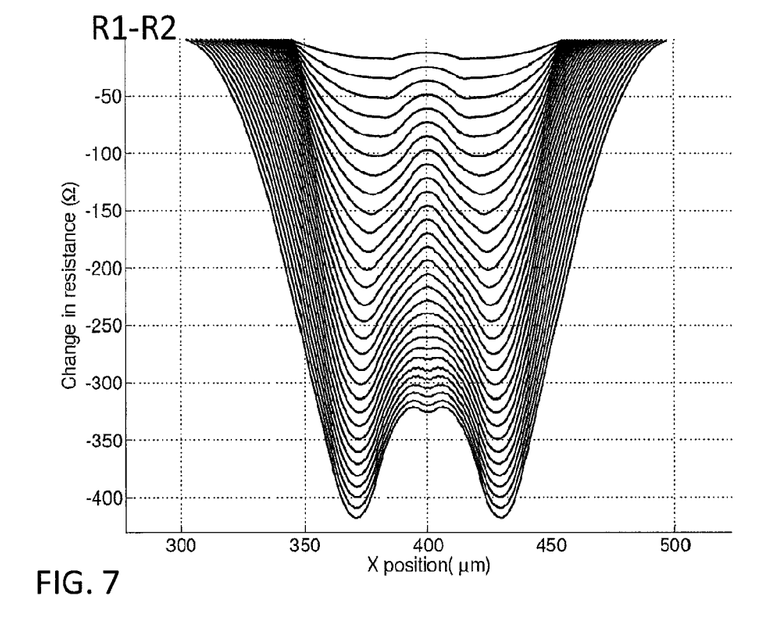

The diagram in FIG. 7 shows the curves for varying vertical positions of the magnetic field source 3, which is equivalent to the varying distance D1 of FIG. 1 when subtracting the output signals R2 and R1 from each other. In an x-range of 385 µm to 415 µm the sensor arrangement is in particular sensitive to variations along the vertical axis Z. Hence, the position to be sensed may also be a z-position instead of in x-position, or, in another embodiment, both x-position and z-position can be sensed simultaneously.

Figure 6:
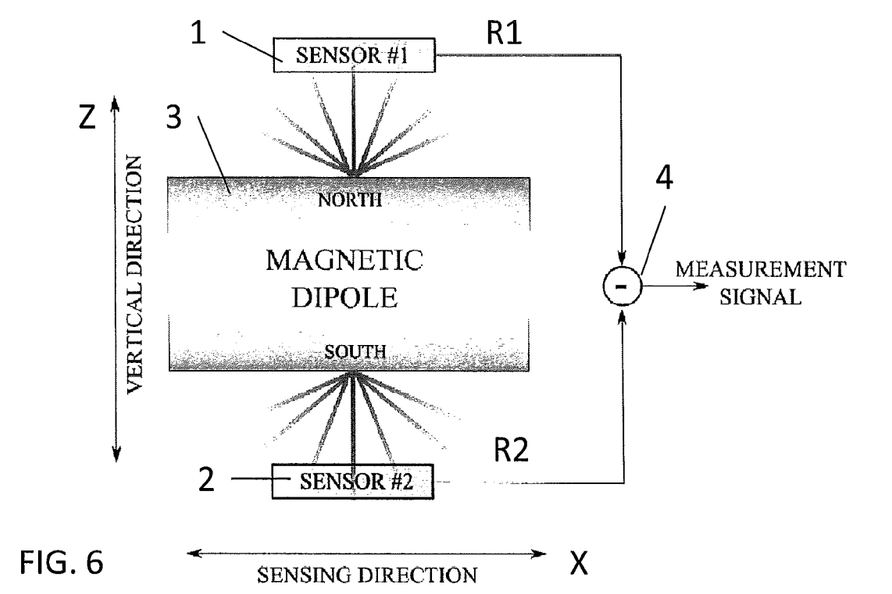

A block diagram of a corresponding sensor arrangement is shown in FIG. 6, which differs from the embodiment in FIG. 4 in that the measurement unit 4 contains a subtraction element for subtracting the second output signal R2 from the first output signal R1.

Figure 8:
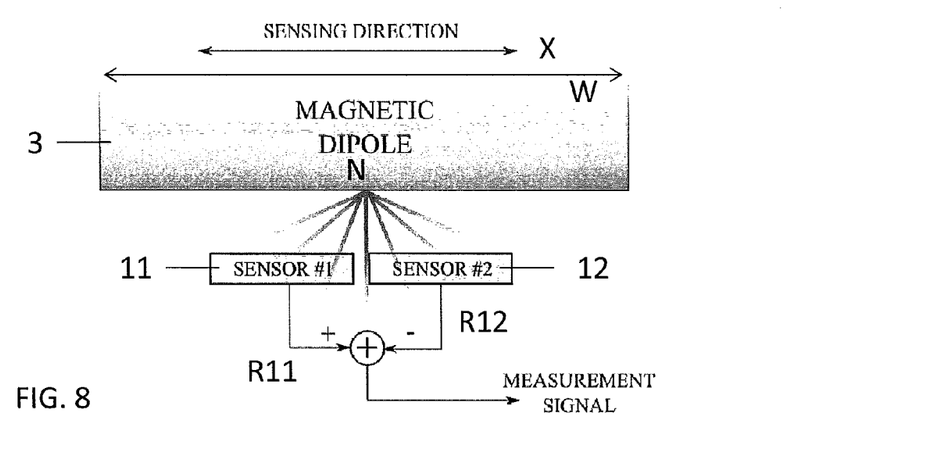

In the schematic diagram of FIG. 8, only a lower portion of the sensor arrangement is shown comprising a magnetic field source 3. Instead of a single first MR element 1, two first MR elements 11 and 12 are arranged in a row along the longitudinal axis X, both MR elements 11 and 12 facing the magnetic field source 3, and specifically its first magnetic pole N. In this example, the dimension of the magnetic field source 3, which preferably is a permanent magnet, is such that the magnetic field not only affects the first MR element 11, but also the other first MR element 12 adjacent. For this purpose, it is preferred that the magnetic field source 3 has a width W along the longitudinal axis X exceeding the longitudinal extension L of the first MR elements 11, 12.

Figure 9:
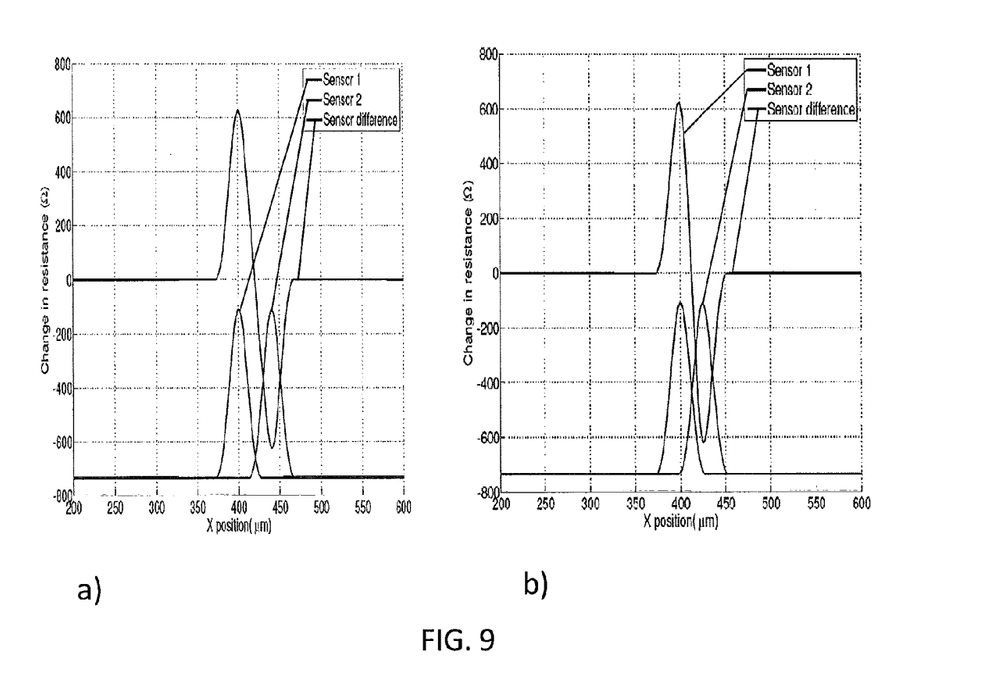

Diagram 9*a*) shows the two corresponding output signals R11 and R12 of the first MR elements 11, 12 as two impulses when that magnetic field source 3 passes. When combining the output signals R11 and R12 by subtraction, e.g. by subtracting R12 from R111 as is illustrated in FIG. 8, the resulting measurement signal R11-R12 ("Sensor difference") is depicted as upper graph in diagram 9*a*). It can be derived, that the linear sensing range in x-direction is enhanced in comparison to using a single MR element 11 only.

The curves in diagram 9*a*) stem from an arrangement of the MR elements 11 and 12 of FIG. 8 in x-direction that e.g. leaves a gap in between. Hence, the individual curves only show a small overlap which leads to an extension of the sensing range by a factor ~2 compared to the sensing range of a single MR element. The curves in diagram 9*b*) instead stems from a closer arrangement of the MR elements 11 and 12 in x-direction than for diagram 9*a*). Hence, the overlap of the individual curves is larger, which leads to a sensing range smaller than by factor ~2 compared to the sensing range of a single MR element. However, the sensitivity exceeds the one of diagram 9*a*). Hence, it can be seen that the sensitivity and the sensing range can be tuned by how close the MR elements of a row are arranged with respect to each other.

Figure 11:
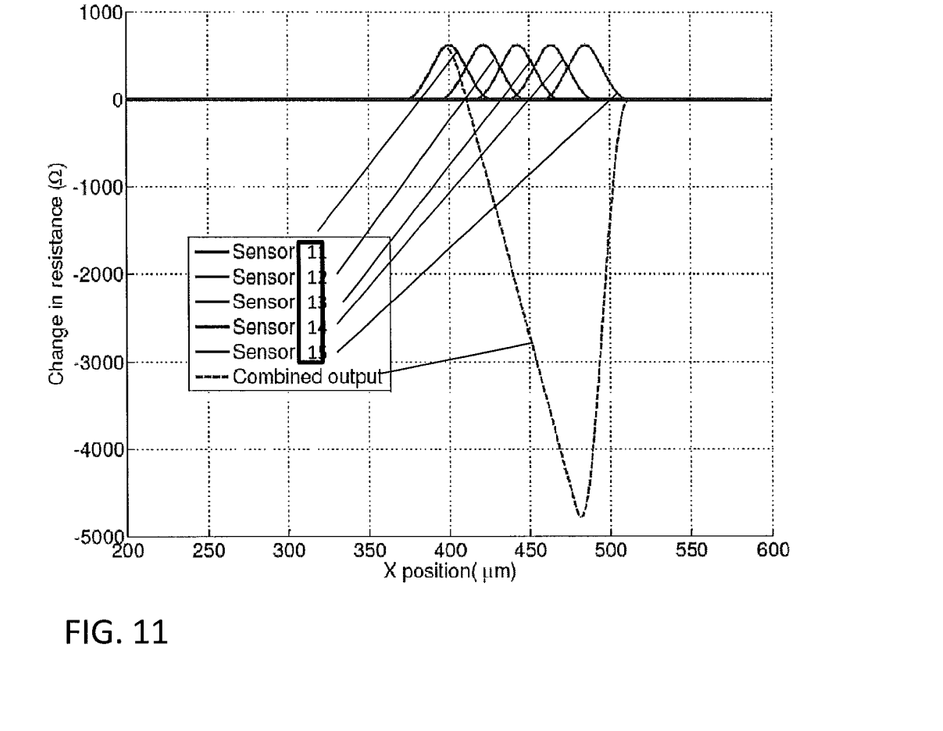

Diagram 11 shows, how multiple MR elements—in the present example five—can be arranged in a row for enhancing the sensing range, and therefore allowing position sensing in a wider sensing range x than with an individual MR element.

Figure 10:
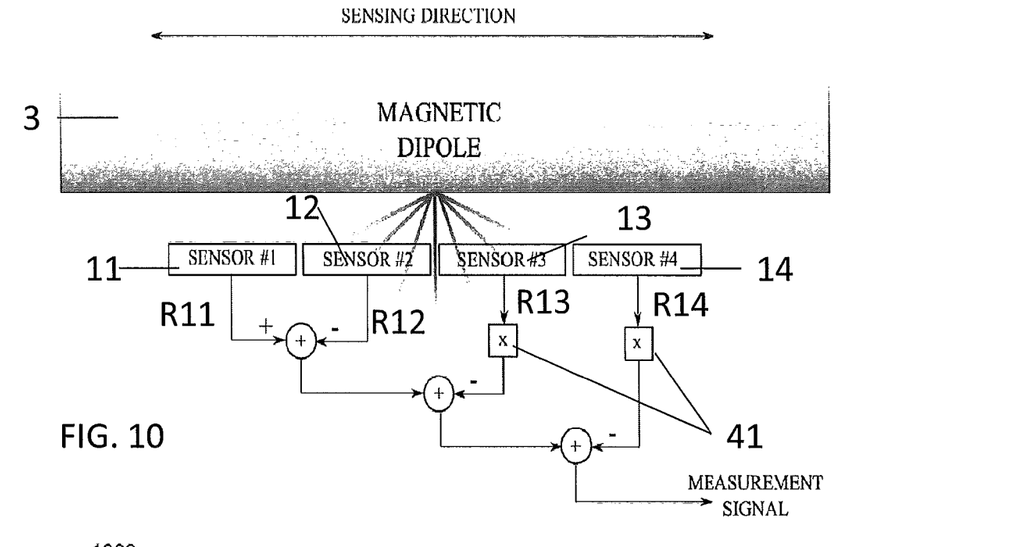

In the block diagram of FIG. 10, this sensing concept is shown for four first MR elements 11, 12, 13 and 14, wherein the subtraction of the associate output signals R12, R13 and R14 from output signal R11—including a scalar multiplication 41 of the output signals R13 and R14—leads to a measurement signal supporting an enhanced sensing range.

Figure 12:
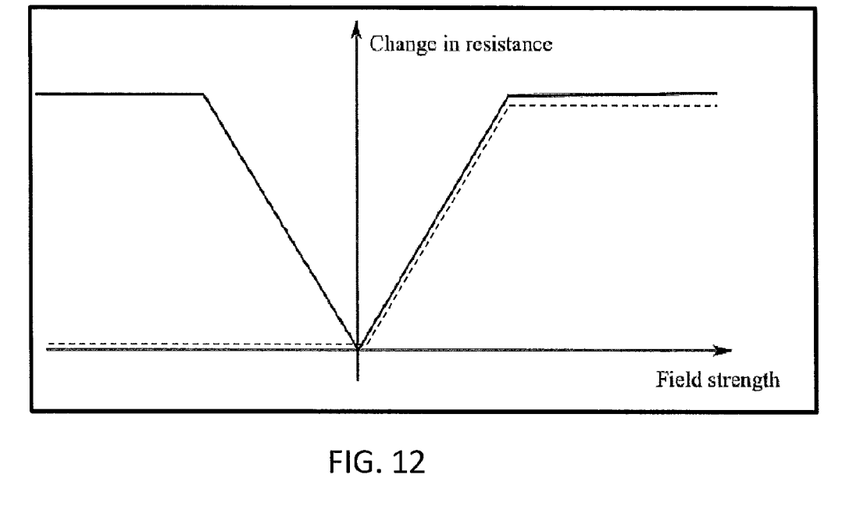
Figure 13:
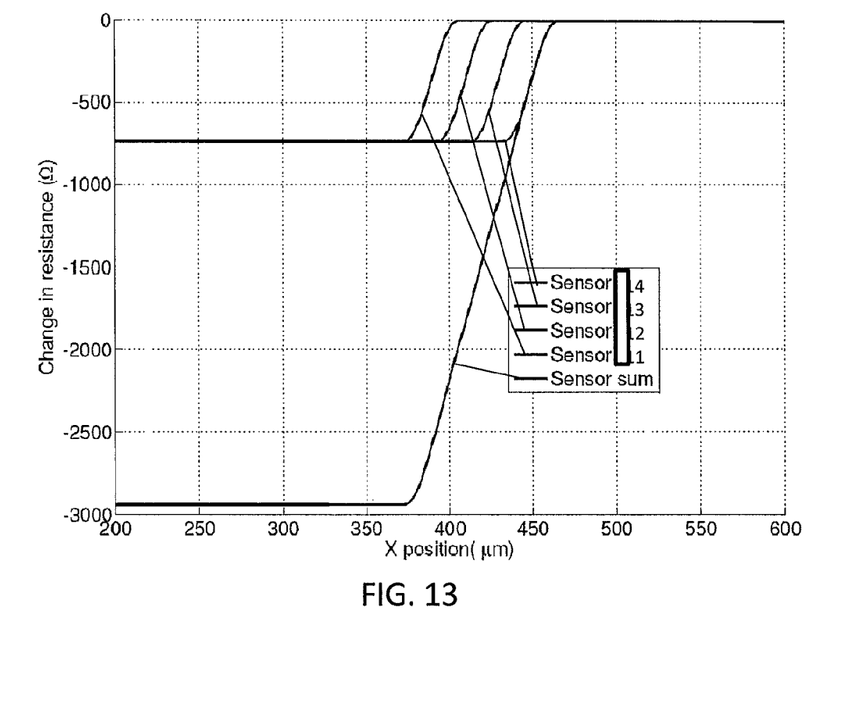

In FIG. 12, the sensing characteristic of an individual MR element is shown, on the one hand with unpinned magnetic layers as a straight line, and on the other hand with one pinned magnetic layer as a dashed line. From the characteristic of the MR element with the pinned magnetic layer, it can be derived that by adding the output signals of multiple first MR elements, in this example four, the linear sensing range can be enhanced. This is shown in FIG. 13.

Figure 14:
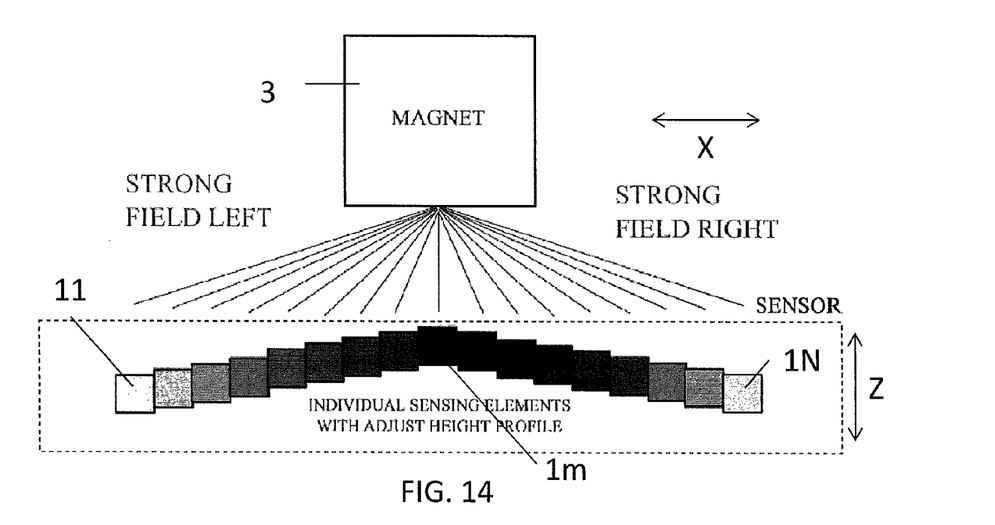
Figure 15:
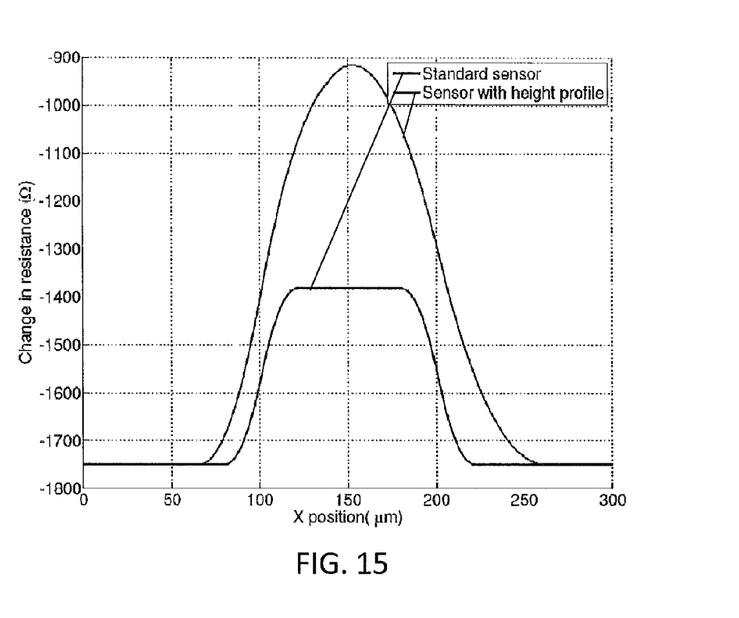

FIG. 14 illustrates a lower portion of a sensor arrangement according to another embodiment of the present invention. Here, a row of multiple first MR elements 11 to 1N is provided. However, the MR elements 11 to 1N differ in their arrangement along the vertical axis Z. A middle magnetoresistive element 1*m* of the row is arranged at a closest vertical distance from the magnetic field source 3 amongst all the first magnetoresistive elements 11 to 1N. In contrast, the outmost magnetoresistive first elements 11 and 1N of the row are arranged at a farthest vertical distance from the magnetic field source 3. Hence, the arrangement of the individual first MR elements 11 to 1N adjusts to the shape of the magnetic field especially if a center position of the magnetic field source 3 over the middle MR element 1m as is shown in FIG. 14 is regarded as operating position. Hence, the MR elements 11 to 1N follow a height profile in arrangement in vertical direction. FIG. 15 illustrates a corresponding characteristic for a sensing arrangement with a height profile.

The embodiments according from FIG. 8 to FIG. 13 are introduced for enhancing the sensing range and/or the sensitivity. The underlying idea is to use multiple MR elements positioned in a row in close proximity to one of the magnetic poles to increase the range and/or the resolution of the sensor arrangement. It is preferred, of course, that the arrangement of second MR elements opposite the second magnetic pole mirrors the arrangement of first MR elements.

However, the arrangement of multiple first MR elements and the corresponding concepts of combining the respective output signals as introduced in FIGS. 8 to 13 can also be applied independent from a one or more second MR element 2, i.e. can be applied without one or more second MR elements 2 at the opposite magnetic pole. Hence, in one embodiment, a configuration of two or more sensors with a differential read-out is proposed which increases the sensing range and/or the resolution by exploiting the characteristics of unpinned GMR valves. Further, a concept of height-profiled sensors and sensing elements is introduced which enables shaping of the sensor in the vertical direction according to the magnetic field and avoids the saturation of the sensing elements. By doing so, the range of the sensor can be significantly increased without losing the sensitivity and resolution. Furthermore, a concept for large-range sensing with pinned GMR valves is presented. Here, the particular sensor characteristics of pinned GMR valves are used to significantly extend the sensing range in an additive read-out scheme.

Figure 16:
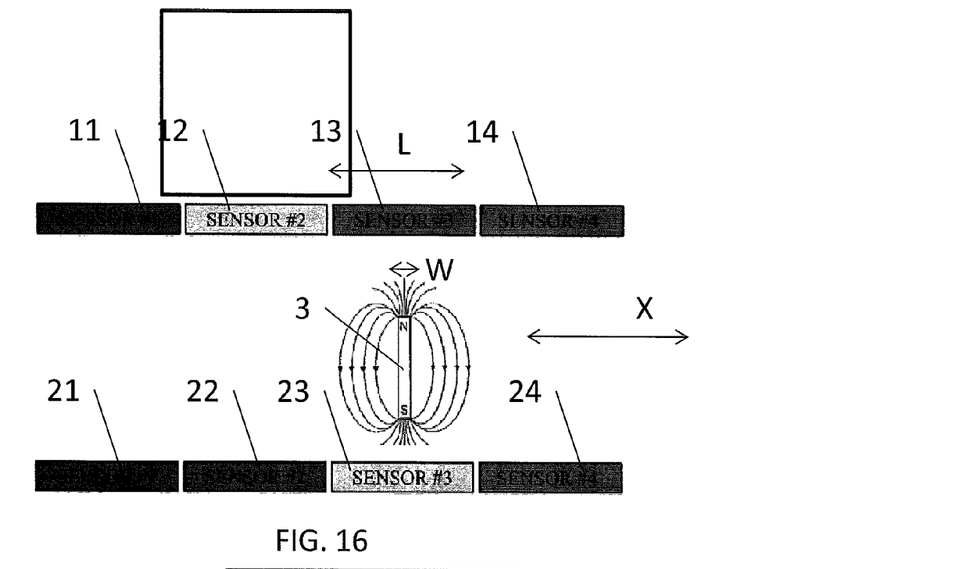

FIG. 16 illustrates another embodiment of a sensor arrangement according to the present invention. Presently, the sensor arrangement comprises four first MR elements 11 to 14 and four second MR elements 21 to 24. However, the number can easily be extended. Again, the magnetic field source 3 in form of a permanent magnet is arranged between the first and second MR elements 1m and 2n, and is movable in x-direction. In this embodiment, the magnetic field source 3 is dimensioned relative to the magnetoresistive elements 1m, 2n such that the magnetic field only affects a single one of the first and a single one of the second MR elements, i.e. exactly these first and second MR elements 1m and 1n the magnetic field source 3 is located in between during the passage in x-direction which are MR elements 13 and 23 in FIG. 16. This is achieved by dimensioning a width W of the magnetic field source less than a length L of any one of the MR elements 1m, 2n. In such arrangement, MR elements 12, 14 and 22, 24 adjacent to the first and second MR elements 13 and 23 that presently monitor a change in resistance in form of a pulse when the magnetic field source 3 passes do not provide such significant change in their output signals. Therefore, the output signals of the various MR elements of one row are not mixed with one and another but each one is individually evaluated as to the appearance of a pulse indicating a passing of the magnetic field source 3. With the knowledge of the positions of the individual MR elements in the sequential arrangement of the first or the second MR elements 1m, 2n a position of the magnetic field source 3 along the longitudinal axis X can be derived.

Figure 17:
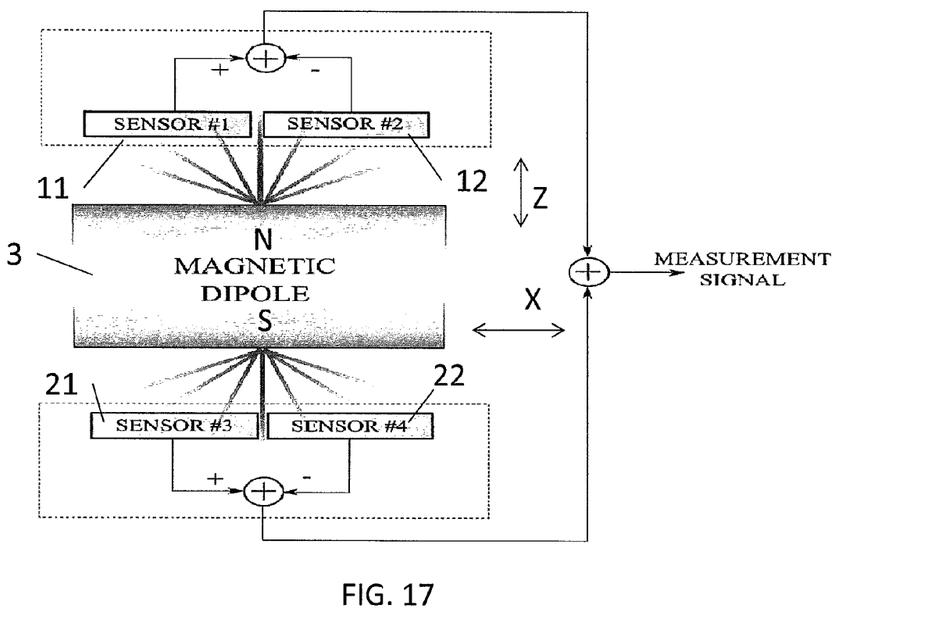

FIG. 17 illustrates a block diagram of a sensor arrangement according to another embodiment of the present invention. Here, the concepts of the embodiments of FIGS. 4 and 8 are merged. Accordingly, two first MR elements 11 and 12 are arranged in a row facing the first magnetic pole N, while two second MR elements 21 and 22 are arranged in a row facing the second magnetic pole S. The output signals from the MR elements of a common row are subtracted from each other, while the results of these subtractions are added. Hence, the overall measurement signal represents a position signal in X that is compensated for variations/disturbances in Z, while at the same time a sensing range in X is increased by providing two first and two second MR elements 11, 12 and 21, 22 next to each other.

Embodiments of the present invention may be applicable to position sensing in industry, to lithography, and specifically in connection with semiconductors such as the manufacturing, EDA and testing of semiconducting devices, and specifically of micro- and/or nano-electromechanical devices. Any such position sensor may transmit its result wire bound or wireless to an evaluation unit.

The invention claimed is:

1. A method for determining the position of an object, comprising:
coupling one of
a magnetic field source (3) providing a magnetic field with a first magnetic pole (N) and a second magnetic pole (S) and
a first and a second magnetoresistive element (1, 2) with an object (5), each of the first and second magnetoresistive elements (1, 2) comprising a stack (11) of layers including at least a conductive layer (112) in between two magnetic layers (111, 113) which layers have a longitudinal extension (L) along a longitudinal axis (X) and a lateral extension along a transverse axis (Y),
arranging the magnetic field source (3) between the first magnetoresistive element (1) and the second magnetoresistive element (2), the magnetic field source having a dipole axis (DA) defined by the first and the second magnetic pole (N, S) extending along a vertical axis (Z) orthogonal to a plane defined by the longitudinal axis (X) and the transverse axis (Y), with the first magnetic pole (N) facing the first magnetoresistive element (1) and the second magnetic pole (S) facing the second magnetoresistive element (2) to form a sensor arrangement,
moving the magnetic field source (3) relative to the first and second magnetoresistive element (1, 2) along the vertical axis (Z), a position (z) thereof along the vertical axis (Z) is to be sensed by the sensor arrangement,
receiving, at a measurement unit, output signals (R1, R2) from the first and the second magnetoresistive elements (1, 2) dependent on their position (x) relative to the magnetic field source (3), and
determining, by the measurement unit, a position (z) along the vertical axis (Z) of the object (5) by computing a difference between the first output signal (R1) and the second output signal (R2).

2. The method as claimed in claim 1, further comprising:
moving the magnetic field source (3) relative to the first and second magnetoresistive element (1, 2) along the longitudinal axis (X), a position (x) thereof along the longitudinal axis (X) is to be sensed by the sensor arrangement, and determining, by the measurement unit, the position (x) along the longitudinal axis (X) by adding the first output signal (R1) and the second output signal (R2).

3. The method as claimed in claim 1, further comprising:
arranging multiple first magnetoresistive elements (1) in the magnetic field in a row along the longitudinal axis (X) and facing the first magnetic pole (N), and
arranging additional multiple second magnetoresistive elements (2) in the magnetic field in a row along the longitudinal axis (X) and facing the second magnetic pole (S).

4. The method as claimed in claim 3, wherein the magnetic field source (3) is dimensioned relative to the multiple first magnetoresistive elements (1) such that the magnetic field only affects a single (1a) of the multiple first magnetoresistive elements (1) at a time but not adjacent first magnetoresistive elements (1b, 1c), and
wherein the magnetic field source (3) is a permanent magnet which has a width (W) less than the longitudinal extension (L) of the first magnetoresistive elements (1).

5. The method as claimed in claim 4, further comprising:
identifying, by the measurement unit, the single first magnetoresistive element (1a) out of the multiple magnetoresistive elements (1) that shows a change in its first output signal (R1) which change results from the magnetic field source (3) passing by the single first magnetoresistive element (1a), and
deriving, by the measurement unit, the position (x) along the longitudinal axis (X) from a known position of the single first magnetoresistive element (1a) within the row of the multiple first magnetoresistive elements (1).

6. The method as claimed in claim 3, wherein the magnetic field source (3) is dimensioned relative to the multiple first magnetoresistive elements (1) such that the magnetic field not only affects a single (1a) of the multiple first magnetoresistive elements (1) but also adjacent first magnetoresistive elements (1b, 1c), and
wherein the magnetic field source (3) is a permanent magnet which has a width (W) along the longitudinal axis (X) exceeding the longitudinal extension (L) of the first magnetoresistive element (1).

7. The method as claimed in claim 6, wherein a magnetization orientation of both of the magnetic layers (111, 113) of the multiple first magnetoresistive elements (1) is unpinned, said method further comprising:
subtracting, by the measurement unit, first output signals (R1) of adjacent first magnetoresistive elements (1) from each other, and
determining, by the measurement unit, the position (x) along the longitudinal axis (X) dependent on a resulting difference signal.

8. The method as claimed in claim 6, wherein a magnetization orientation of one of the magnetic layers (111, 113) of the multiple first magnetoresistive elements (1) is pinned, said method further comprising:
adding, by the measurement unit, the first output signals (R1) of adjacent first magnetoresistive elements (1), and
determining, by the measurement unit, the position (x) along the longitudinal axis (X) dependent on a resulting sum signal.

9. The method as claimed in claim 3, further comprising:
arranging the multiple first magnetoresistive elements (1) in the row offset from each other along the vertical axis (Z).

10. The method as claimed in claim 4, further comprising:
arranging a middle first magnetoresistive element (1m) at a closest vertical distance from the magnetic field source (3) amongst the multiple first magnetoresistive elements (1) of the row, and
arranging outmost first magnetoresistive elements (1) at a farthest vertical distance from the magnetic field source (3) amongst the multiple first magnetoresistive elements (1) of the row.

11. The method of claim 1, further comprising:
coupling one of the magnetoresistive elements (1, 2) and the magnetic field source (3) to an object (5), the position of which object (5) is to be sensed by the sensor arrangement.

* * * * *